(12) United States Patent
Fu et al.

(10) Patent No.: US 11,658,650 B1
(45) Date of Patent: May 23, 2023

(54) PULSE WIDTH MODULATION CONTROLLER AND CONTROL METHOD THEREOF

(71) Applicant: Richtek Technology Corporation, Zhubei (TW)

(72) Inventors: Jian-Ming Fu, Zhubei (TW); Huan-Chien Yang, New Taipei (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 17/722,796

(22) Filed: Apr. 18, 2022

Related U.S. Application Data

(60) Provisional application No. 63/300,653, filed on Jan. 19, 2022.

(30) Foreign Application Priority Data

Mar. 29, 2022 (TW) .................................. 111111844

(51) Int. Cl.
*H03K 7/08* (2006.01)
*G01R 19/10* (2006.01)

(52) U.S. Cl.
CPC .............. *H03K 7/08* (2013.01); *G01R 19/10* (2013.01)

(58) Field of Classification Search
CPC .................................. H03K 7/08; G01R 19/10
See application file for complete search history.

(56) References Cited

U.S. PATENT DOCUMENTS

| | | | |
|---|---|---|---|
| 9,960,620 B2 | 5/2018 | Kinzer et al. | |
| 10,439,483 B2 | 10/2019 | Tsyrganovich et al. | |
| 2016/0124447 A1* | 5/2016 | Kobayashi | G05F 1/575 |
| | | | 323/280 |
| 2019/0238100 A1* | 8/2019 | Kimura | G01R 31/40 |

FOREIGN PATENT DOCUMENTS

| | | |
|---|---|---|
| TW | 201235811 A | 9/2012 |
| TW | 201937837 A | 9/2019 |
| TW | 202129455 A | 8/2021 |

\* cited by examiner

*Primary Examiner* — John W Poos
*Assistant Examiner* — Tyler J Pereny
(74) *Attorney, Agent, or Firm* — McClure, Qualey & Rodack, LLP

(57) ABSTRACT

A PWM (Pulse Width Modulation) controller includes a current detector, a current emulator, a voltage-to-current converter, and a current adder. The current detector detects a first current, and generates a second current according to the first current. The current detector receives an input voltage and outputs an output voltage. The current emulator obtains the relative information of a lower-gate current. The voltage-to-current converter draws a third current from the current emulator according to the input voltage and the output voltage. The current emulator generates a fourth current according to the relative information and the third current. The current adder adds the fourth current to the second current, so as to generate a sum current.

20 Claims, 5 Drawing Sheets

PULSE WIDTH MODULATION CONTROLLER AND CONTROL METHOD THEREOF

CROSS REFERENCE TO RELATED APPLICATIONS

This application claims priority to U.S. Provisional Application Ser. No. 63/300,653, filed on Jan. 19, 2022, and also claims priority of Taiwan Patent Application No. 111111844 filed on Mar. 29, 2022, the entirety of which is incorporated by reference herein.

BACKGROUND OF THE INVENTION

Field of the Invention

The disclosure generally relates to a PWM (Pulse Width Modulation) controller, and more specifically, to a PWM controller for reducing distortion.

Description of the Related Art

In a conventional design, a PWM (Pulse Width Modulation) controller often has the disadvantages of insufficient current information delivery and too long a transient response time, which result in the output distortion and overall poor linearity. Accordingly, there is a need to propose a novel solution for solving the problems of the prior art.

BRIEF SUMMARY OF THE INVENTION

In an exemplary embodiment, the invention is directed to a PWM (Pulse Width Modulation) controller that includes a current detector, a current emulator, a voltage-to-current converter, and a current adder. The current detector detects a first current, and generates a second current according to the first current. The current detector receives an input voltage and outputs an output voltage. The current emulator obtains the relative information of a lower-gate current. The voltage-to-current converter draws a third current from the current emulator according to the input voltage and the output voltage. The current emulator generates a fourth current according to the relative information and the third current. The current adder adds the fourth current to the second current, so as to generate a sum current.

In some embodiments, the second current is substantially proportional to the first current.

In some embodiments, the fourth current approaches to the second current.

In some embodiments, the current detector includes a first transistor, a second transistor, a third transistor, and an inductor. The first transistor has a control terminal coupled to a first node, a first terminal coupled to an input node for receiving the input voltage, and a second terminal coupled to a second node. The inductor has a first terminal coupled to the second node, and a second terminal coupled to an output node for outputting the output voltage. The second transistor has a control terminal coupled to the first node, a first terminal coupled to a third node, and a second terminal coupled to the input node. The third transistor has a control terminal coupled to the first node, a first terminal coupled to a fourth node, and a second terminal coupled to the second node. The first current flows through the first transistor.

In some embodiments, the current detector further includes a fourth transistor and a fifth transistor. The fourth transistor has a control terminal coupled to a fifth node, a first terminal coupled to the third node, and a second terminal coupled to the fifth node. The fifth transistor has a control terminal coupled to the fifth node, a first terminal coupled to the fourth node, and a second terminal coupled to a sixth node.

In some embodiments, the current detector further includes a sixth transistor and a seventh transistor. The sixth transistor has a control terminal coupled to a seventh node, a first terminal coupled to the fifth node, and a second terminal coupled to an eighth node. The seventh transistor has a control terminal coupled to the seventh node, a first terminal coupled to the sixth node, and a second terminal coupled to a ninth node.

In some embodiments, the current detector further includes an output transistor, a first current sink, and a second current sink. The output transistor has a control terminal coupled to the sixth node, a first terminal coupled to the third node, and a second terminal coupled to a first addition node for outputting the second current. The first current sink draws a first bias current from the eighth node. The second current sink draws a second bias current from the ninth node. The second bias current is substantially equal to the first bias current.

In some embodiments, each of the first transistor, the second transistor, and the third transistor is an NMOS transistor (N-type Metal Oxide Semiconductor Field Effect Transistor).

In some embodiments, each of the fourth transistor, the fifth transistor, the sixth transistor, the seventh transistor, and the output transistor is a PMOS transistor (P-type Metal Oxide Semiconductor Field Effect Transistor).

In some embodiments, the current emulator includes an eighth transistor and a ninth transistor. The eighth transistor has a control terminal coupled to a tenth node, a first terminal coupled to a ground voltage, and a second terminal coupled to the tenth node for receiving the lower-gate current. The ninth transistor has a control terminal coupled to the tenth node, a first terminal coupled to the ground voltage, and a second terminal coupled to an eleventh node.

In some embodiments, the current emulator further includes a tenth transistor, a first switch element, and a capacitor. The tenth transistor has a control terminal coupled to the eleventh node, a first terminal coupled to a supply voltage, and a second terminal coupled to the eleventh node. The first switch element has a first terminal coupled to the eleventh node, and a second terminal coupled to a twelfth node. The capacitor has a first terminal coupled to the supply voltage, and a second terminal coupled to the twelfth node.

In some embodiments, the current emulator further includes an eleventh transistor and a second switch element. The eleventh transistor has a control terminal coupled to the twelfth node, a first terminal coupled to the supply voltage, and a second terminal coupled to a second addition node for outputting the fourth current. The second switch element has a first terminal coupled to the twelfth node, and a second terminal coupled to a thirteenth node.

In some embodiments, each of the eighth transistor and the ninth transistor is an NMOS transistor.

In some embodiments, each of the tenth transistor and the eleventh transistor is a PMOS transistor.

In some embodiments, the first switch element is selectively closed or opened according to a first control voltage. The second switch element is selectively closed or opened according to a second control voltage.

In some embodiments, the first control voltage and the second control voltage substantially have complementary logic levels.

In some embodiments, the voltage-to-current converter includes a first resistor and a second resistor. The first resistor has a first terminal for receiving the input voltage, and a second terminal coupled to a fourteenth node. The second resistor has a first terminal coupled to the fourteenth node, and a second terminal coupled to the ground voltage.

In some embodiments, the voltage-to-current converter further includes a third resistor and a fourth resistor. The third resistor has a first terminal for receiving the output voltage, and a second terminal coupled to a fifteenth node. The fourth resistor has a first terminal coupled to the fifteenth node, and a second terminal coupled to the ground voltage.

In some embodiments, the voltage-to-current converter further includes a comparison circuit and a dependent current sink. The comparison circuit has a positive input terminal coupled to the fourteenth node, a negative input terminal coupled to the fifteenth node, and an output terminal for outputting a third control voltage. The dependent current sink draws the third current from the thirteenth node according to the third control voltage. The third current is substantially proportional to a voltage difference between the input voltage and the output voltage.

In another exemplary embodiment, the invention is directed to a control method for PWM. The control method includes the steps of: detecting a first current, and generating a second current according to the first current; obtaining relative information of a lower-gate current via a current emulator; drawing a third current from the current emulator according to an input voltage and an output voltage; generating a fourth current via the current emulator according to the relative information and the third current; and adding the fourth current to the second current, so as to generate a sum current.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail below.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
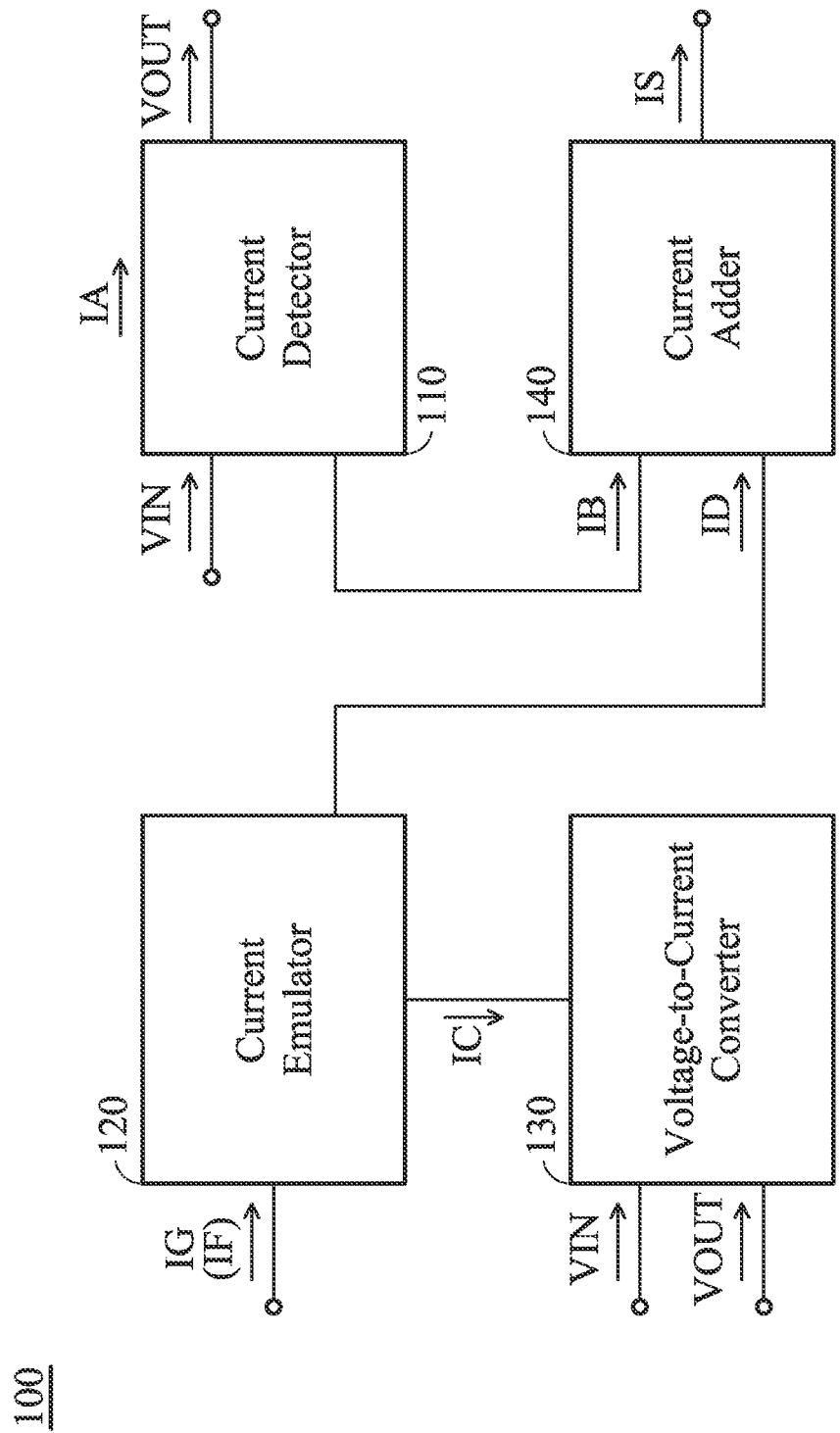
FIG. 1 is a diagram of a PWM (Pulse Width Modulation) controller according to an embodiment of the invention.

FIG. 1 is a diagram of a PWM (Pulse Width Modulation) controller 100 according to an embodiment of the invention. For example, the PWM controller 100 may be applied to a mobile device or an automotive chip, but it is not limited thereto. In the embodiment of FIG. 1, the PWM controller 100 includes a current detector 110, a current emulator 120, a voltage-to-current converter 130, and a current adder 140. It should be understood that the PWM controller 100 may include other components, such as a processor, an upper-gate circuit, a lower-gate circuit, and/or a driving circuit, although they are not displayed in FIG. 1.

The current detector 110 detects a first current IA, and generates a second current IB according to the first current IA. For example, the second current IB may be substantially proportional to the first current IA. The current detector 110 also receives an input voltage VIN and outputs an output voltage VOUT. The current emulator 120 obtains the relative information IF of a lower-gate current IG. The lower-gate current IG may be from a lower-gate circuit (not shown). The voltage-to-current converter 130 draws a third current IC from the current emulator 120 according to the input voltage VIN and the output voltage VOUT. The current emulator 120 also generates a fourth current ID according to the relative information IF of the lower-gate current IG and the third current IC. Finally, the current adder 140 adds the fourth current ID to the second current IB, so as to generate a sum current IS. For example, the fourth current ID may approach to the second current IB. With the design of the invention, the operational information of the current detector 110, the current emulator 120, and the voltage-to-current converter 130 can be easily obtained by analyzing the sum current IS. According to practical measurements, the proposed PWM controller 100 can help to reduce its transient response time, suppress its output distortion, and enhances overall linearity.

The following embodiments will introduce the detailed structures and the operational principles of the PWM controller 100. It should be understood these figures and descriptions are merely exemplary, rather than limitations of the invention.

Figure 2:
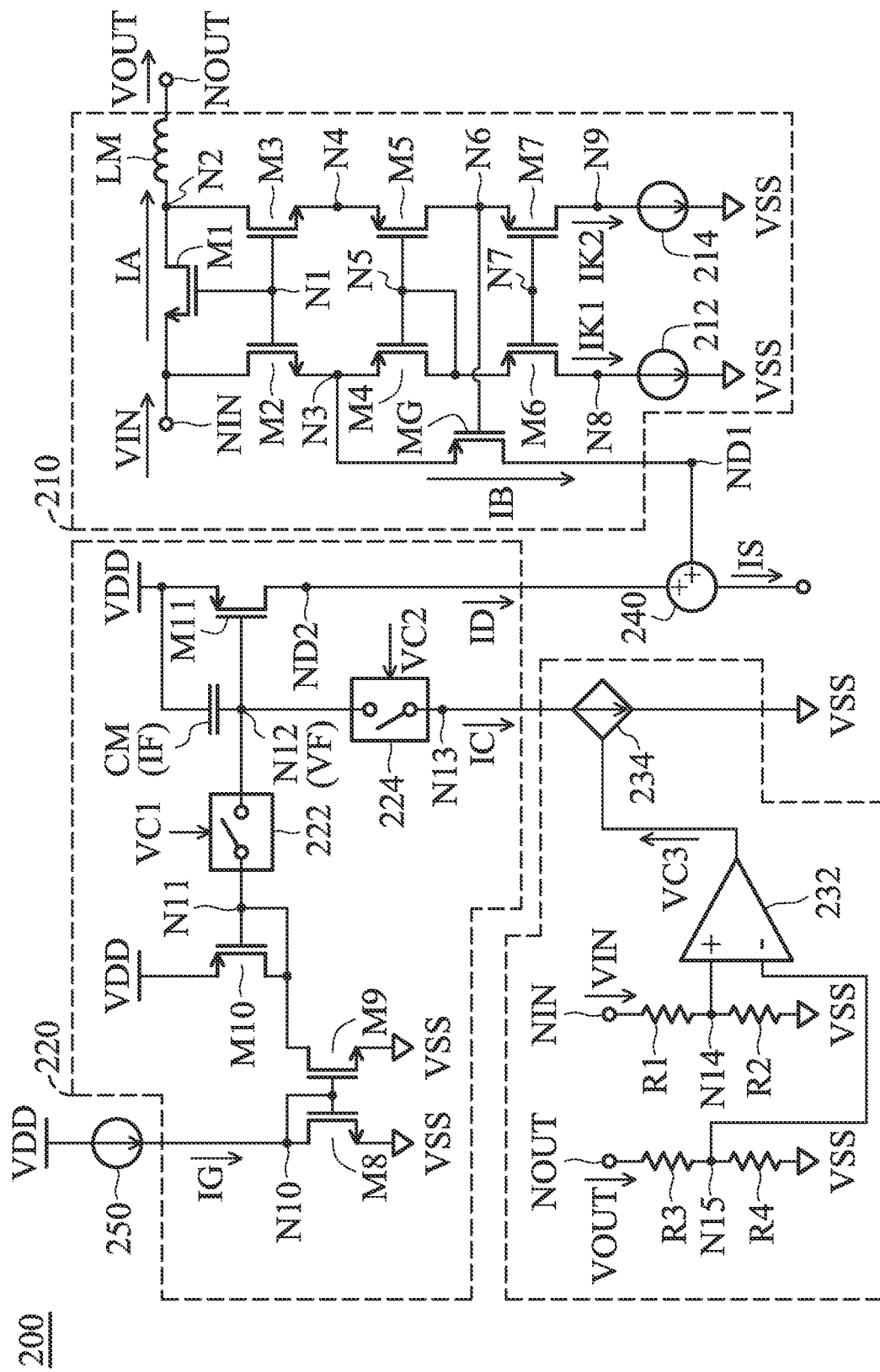
FIG. 2 is a circuit diagram of a PWM controller according to an embodiment of the invention.

FIG. 2 is a circuit diagram of a PWM controller 200 according to an embodiment of the invention. In the embodiment of FIG. 2, the PWM controller 100 with an input node NIN and an output node NOUT includes a current detector 210, a current emulator 220, a voltage-to-current converter 230, and a current adder 240. The input node NIN of the PWM controller 200 is arranged to receive an input voltage VIN. The output node NOUT of the PWM controller 200 is arranged to output an output voltage VOUT.

The current detector 210 includes a first current sink 212, a second current sink 214, a first transistor M1, a second transistor M2, a third transistor M3, a fourth transistor M4, a fifth transistor M5, a sixth transistor M6, a seventh transistor M7, an output transistor MG, and an inductor LM. For example, each of the first transistor M1, the second transistor M2, and the third transistor M3 may be an NMOS transistor (N-type Metal Oxide Semiconductor Field Effect Transistor or NMOSFET). Each of the fourth transistor M4, the fifth transistor M5, the sixth transistor M6, the seventh transistor M7, and the output transistor MG may be a PMOS transistor (P-type Metal Oxide Semiconductor Field Effect Transistor or PMOSFET).

The first transistor M1 has a control terminal (e.g., a gate) coupled to a first node N1, a first terminal (e.g., a source) coupled to the input node NIN, and a second terminal (e.g., a drain) coupled to a second node N2. It should be noted that a first current IA can flow through the first transistor M1. The inductor LM has a first terminal coupled to the second node N2, and a second terminal coupled to the output node NOUT. The second transistor M2 has a control terminal (e.g., a gate) coupled to the first node N1, a first terminal (e.g., a source) coupled to a third node N3, and a second terminal (e.g., a drain) coupled to the input node NIN. The third transistor M3 has a control terminal (e.g., a gate) coupled to the first node N1, a first terminal (e.g., a source) coupled to a fourth node N4, and a second terminal (e.g., a drain) coupled to the second node N2.

The fourth transistor M4 has a control terminal (e.g., a gate) coupled to a fifth node N5, a first terminal (e.g., a source) coupled to the third node N3, and a second terminal (e.g., a drain) coupled to the fifth node N5. The fifth transistor M5 has a control terminal (e.g., a gate) coupled to the fifth node N5, a first terminal (e.g., a source) coupled to the fourth node N4, and a second terminal (e.g., a drain) coupled to a sixth node N6.

The sixth transistor M6 has a control terminal (e.g., a gate) coupled to a seventh node N7, a first terminal (e.g., a source) coupled to the fifth node N5, and a second terminal (e.g., a drain) coupled to an eighth node N8. The seventh transistor M7 has a control terminal (e.g., a gate) coupled to the seventh node N7, a first terminal (e.g., a source) coupled to the sixth node N6, and a second terminal (e.g., a drain) coupled to a ninth node N9.

The output transistor MG has a control terminal (e.g., a gate) coupled to the sixth node N6, a first terminal (e.g., a source) coupled to the third node N3, and a second terminal (e.g., a drain) coupled to a first addition node ND1 for outputting a second current IB. The first current sink 212 draws a first bias current IK1 from the eighth node N8. The second current sink 214 draws a second bias current IK2 from the ninth node N9. For example, the second bias current IK2 may be substantially equal to the first bias current IK1.

The current emulator 220 includes a first switch element 222, a second switch element 224, an eighth transistor M8, a ninth transistor M9, a tenth transistor M10, an eleventh transistor M11, and a capacitor CM. For example, each of the eighth transistor M8 and the ninth transistor M9 may be an NMOS transistor. Each of the tenth transistor M10 and the eleventh transistor M11 may be a PMOS transistor.

The eighth transistor M8 has a control terminal (e.g., a gate) coupled to a tenth node N10, a first terminal (e.g., a source) coupled to a ground voltage VSS, and a second terminal (e.g., a drain) coupled to the tenth node N10 for receiving a lower-gate current IG. In some embodiments, the PWM controller 200 further includes a lower-gate current source 250 for outputting the lower-gate current IG to the tenth node N10. For example, the lower-gate current source 250 may represent the relative lower-gate circuit, whose circuit structure is not limited in the invention. The ninth transistor M9 has a control terminal (e.g., a gate) coupled to the tenth node N10, a first terminal (e.g., a source) coupled to the ground voltage VSS, and a second terminal (e.g., a drain) coupled to an eleventh node N11.

The tenth transistor M10 has a control terminal (e.g., a gate) coupled to the eleventh node N11, a first terminal (e.g., a source) coupled to a supply voltage VDD, and a second terminal (e.g., a drain) coupled to the eleventh node N11. The first switch element 222 has a first terminal coupled to the eleventh node N11, and a second terminal coupled to a twelfth node N12. The first switch element 222 is selectively closed or opened according to a first control voltage VC1. For example, if the first control voltage VC1 has a high logic level (e.g., a logic "1"), the first switch element 222 may be closed. Conversely, if the first control voltage VC1 has a low logic level (e.g., a logic "0"), the first switch element 222 may be opened. The capacitor CM has a first terminal coupled to the supply voltage VDD, and a second terminal coupled to the twelfth node N12.

The eleventh transistor M11 has a control terminal (e.g., a gate) coupled to the twelfth node N12, a first terminal (e.g., a source) coupled to the supply voltage VDD, and a second terminal (e.g., a drain) coupled to a second addition node ND2 for outputting a fourth current ID. The second switch element 224 has a first terminal coupled to the twelfth node N12, and a second terminal coupled to a thirteenth node N13. The second switch element 224 is selectively closed or opened according to a second control voltage VC2. For example, if the second control voltage VC2 has a high logic level, the second switch element 224 may be closed. Conversely, if the second control voltage VC2 has a low logic level, the second switch element 224 may be opened.

For example, the first control voltage VC1 and the second control voltage VC2 may be from an upper-gate driver and a lower-gate driver, respectively (not shown). In some embodiments, the first control voltage VC1 and the second control voltage VC2 substantially have complementary logic levels. Thus, one of the first switch element 222 and the second switch element 224 is closed, and the other of the first switch element 222 and the second switch element 224 is opened. However, the invention is not limited thereto. In alternative embodiments, the first control voltage VC1 and the second control voltage VC2 each have a low logic level, such that the first switch element 222 and the second switch element 224 are both opened.

The voltage-to-current converter 230 includes a comparison circuit 232, a dependent current sink 234, a first resistor R1, a second resistor R2, a third resistor R3, and a fourth resistor R4.

The first resistor R1 has a first terminal coupled to the input node NIN for receiving the input voltage VIN, and a second terminal coupled to a fourteenth node N14. The second resistor R2 has a first terminal coupled to the fourteenth node N14, and a second terminal coupled to the ground voltage VSS. The third resistor R3 has a first terminal coupled to the output node NOUT for receiving the output voltage VOUT, and a second terminal coupled to a fifteenth node N15. The fourth resistor R4 has a first terminal coupled to the fifteenth node N15, and a second terminal coupled to the ground voltage VSS. In some embodiments, the ratio (R1/R2) of the first resistor R1's resistance to the second resistor R2's resistance is substantially equal to the ratio (R3/R4) of the third resistor R3's resistance to the fourth resistor R4's resistance. For example, the aforementioned ratio (R1/R2 or R3/R4) may be equal to 14, but it is not limited thereto.

The comparison circuit 232 has a positive input terminal coupled to the fourteenth node N14, a negative input terminal coupled to the fifteenth node N15, and an output terminal for outputting a third control voltage VC3. The dependent current sink 234 draws a third current IC from the thirteenth node N13 according to the third control voltage VC3. In some embodiments, the third current IC is substantially proportional to a voltage difference between the input voltage VIN and the output voltage VOUT. That is, the combination of the comparison circuit 232 and the dependent current sink 234 is considered as an equivalent transconductance amplifier. However, the detail implementations of the comparison circuit 232 and the dependent current sink 234 are not limited in the invention.

Finally, the current adder 240 receives the second current IB from the first addition node ND1, receives the fourth current ID from the second addition node ND2, and adds the fourth current ID to the second current IB, so as to generate a sum current IS (i.e., IS=IB+ID).

Figure 3:
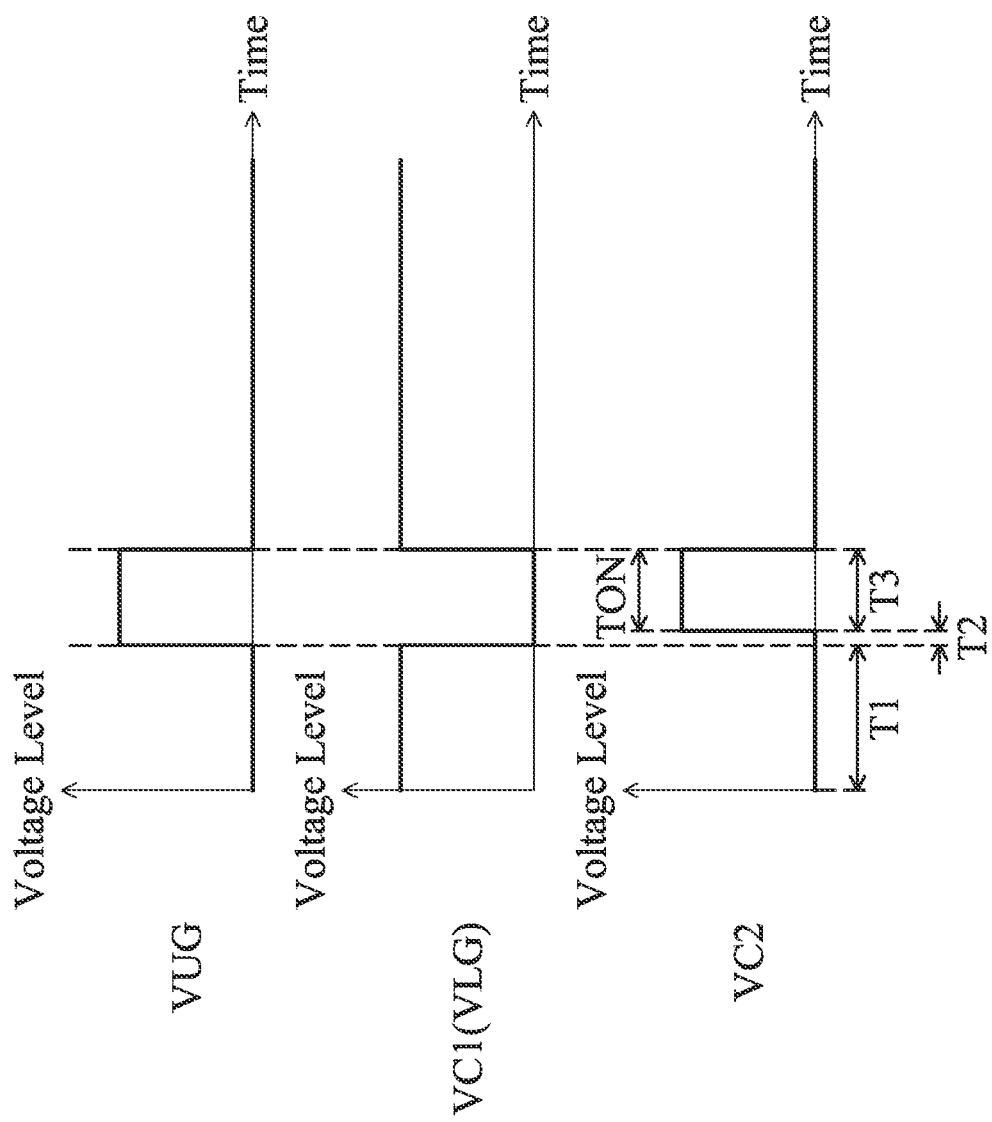
FIG. 3 is a diagram of voltage waveforms of a PWM controller according to an embodiment of the invention.

FIG. 3 is a diagram of voltage waveforms of the PWM controller 200 according to an embodiment of the invention. The horizontal axis represents time, and the vertical axis represents each voltage level. In the embodiment of FIG. 3, the first control voltage VC1 is also considered as a lower-gate driving voltage VLG, and it and an upper-gate driving voltage VUG have complementary logic levels. In addition, the second control voltage VC2 and the upper-gate driving voltage VUG substantially have the same waveforms, but the second control voltage VC2 is slightly lagging the upper-gate driving voltage VUG by a phase delay. Please refer to FIG. 2 and FIG. 3 together to understand the operational principles of the PWM controller 200.

During a first operational stage T1, the first control voltage VC1 has a high logic level and the second control voltage VC2 has a low logic level, such that the first switch element 222 is closed and the second switch element 224 is opened. At this time, the relative information IF of the lower-gate current IG can be recorded as a capacitive voltage VF at the twelfth node N12 because there are a first current source formed by the eighth transistor M8 and the ninth transistor M9 and a second current source formed by the tenth transistor M10 and the eleventh transistor M11.

During a second operational stage T2, the first control voltage VC1 and the second control voltage VC2 each have a low logic level, such that the first switch element 222 and the second switch element 224 are both opened. At this time, the aforementioned capacitive voltage VF is maintained and stored in the capacitor CM. It should be noted that the duration of the second operational stage T2 is very short.

During a third operational stage T3, the first control voltage VC1 has a low logic level and the second control voltage VC2 has a high logic level, such that the first switch element 222 is opened and the second switch element 224 is closed. The second control voltage VC2 provides high logic duration TON. Within the high logic duration TON, the dependent current sink 234 draws the third current IC through the closed second switch element 224 from the capacitor CM, so as to discharge the capacitive voltage VF. Since the capacitive voltage VF gradually decreases, the fourth current ID from the eleventh transistor M11 gradually increases. In some embodiments, the operational principles of the PWM controller 200 will be described according to the following equations (1) to (7):

$$\frac{R2}{R1+R2} = \frac{R4}{R3+R4} = DF \tag{1}$$

where "R1" represents the resistance of the first resistor R1, "R2" represents the resistance of the second resistor R2, "R3" represents the resistance of the third resistor R3, "R4" represents the resistance of the fourth resistor R4, and "DF" represents a voltage divider factor of the voltage-to-current converter 230.

$$IC = (VIN - VOUT) \cdot DF \cdot Gm \tag{2}$$

where "IC" represents the current magnitude of the third current IC, "VIN" represent the voltage level of the input voltage VIN, "VOUT" represents the voltage level of the output voltage VOUT, and "Gm" represents the whole transconductance of the comparison circuit 232 and the dependent current sink 234.

$$\Delta V = \frac{IC \cdot TON}{CM} \tag{3}$$

where "$\Delta V$" represents the voltage drop of the capacitive voltage VF due to the discharging operation of the third current IC, "TON" represents the high logic duration TON of the second control voltage VC2, and "CM" represents the capacitance of the capacitor CM.

$$ID = ID0 + \Delta V \cdot gm = ID0 + \frac{IC \cdot TON}{CM} \cdot gm \tag{4}$$

$$ID = ID0 + (VIN - VOUT) \cdot DF \cdot Gm \cdot \frac{TON}{CM} \cdot gm \tag{5}$$

where "ID0" represents the initial current magnitude of the fourth current ID, and "gm" represents the small-signal transconductance of the eleventh transistor M11.

$$IA = IA0 + \frac{(VIN - VOUT)}{LM} \cdot TON \tag{6}$$

where "IA0" represents the initial current magnitude of the first current IA, and "LM" represents the inductance of the inductor LM.

$$IB = \frac{IA}{DS} = \left[IA0 + \frac{(VIN - VOUT)}{LM} \cdot TON\right]/DS \tag{7}$$

Where "IB" represents the current magnitude of the second current IB, and "DS" represents the current ratio of the second current D3 to the first current IA.

According to the equations (1) to (7), both of the second current D3 and the fourth current ID are relative to the voltage difference between the input voltage VIN and the output voltage VOUT. It should be noted that the current emulator 220 has a simpler structure and a shorter response time than those of the current detector 210. Therefore, when the second current IB of the current detector 210 has not entered a stable state, the fourth current ID of the current emulator 220 can replace the second current D3 and provide similar current information, so as to suppress the output distortion of the PWM controller 200.

In some embodiments, if the assumption of the following equation (8) is applied, the second current IB and the fourth current ID will be equal to each other, and the relationship between the above element parameters will be simplified as the following equation (9):

$$\frac{IA0}{DS} = ID0 \tag{8}$$

-continued $$CM = L \cdot DF \cdot DS \cdot gm \qquad (9)$$

For example, based on the equations (8) and (9), the capacitance of the capacitor CM may be set to 16.45 pF, the inductance of the inductor LM may be set to 1.5 µH, the voltage divider factor DF may be set to 0.0667, the current ratio DS may be set to 32577, and the small-signal transconductance gm of the eleventh transistor M11 may be set to 0.4 mA/V, but they are not limited thereto.

Figure 4:
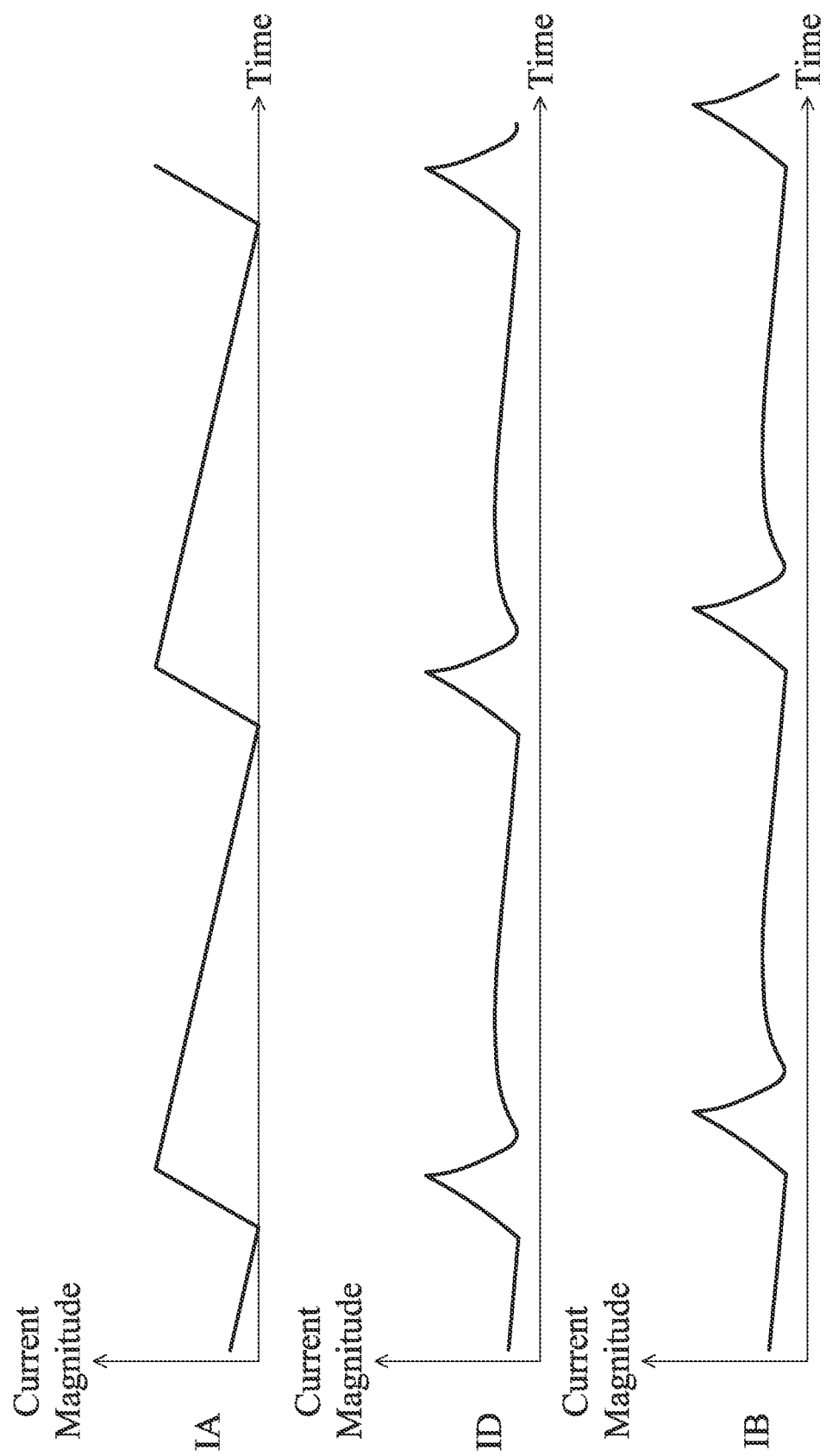
FIG. 4 is a diagram of current waveforms of a PWM controller according to an embodiment of the invention.

FIG. 4 is a diagram of current waveforms of the PWM controller 200 according to an embodiment of the invention. The horizontal axis represents time, and the vertical axis represents each current magnitude. According to the measurement of FIG. 4, regardless of the variation of the first current IA, the second current IB and the fourth current ID have similar waveforms, and the phase of the fourth current ID is leading that of the second current D3. It should be understood that the fourth current ID is considered as a pseudo lower-gate current for providing real-time current information.

Figure 5:
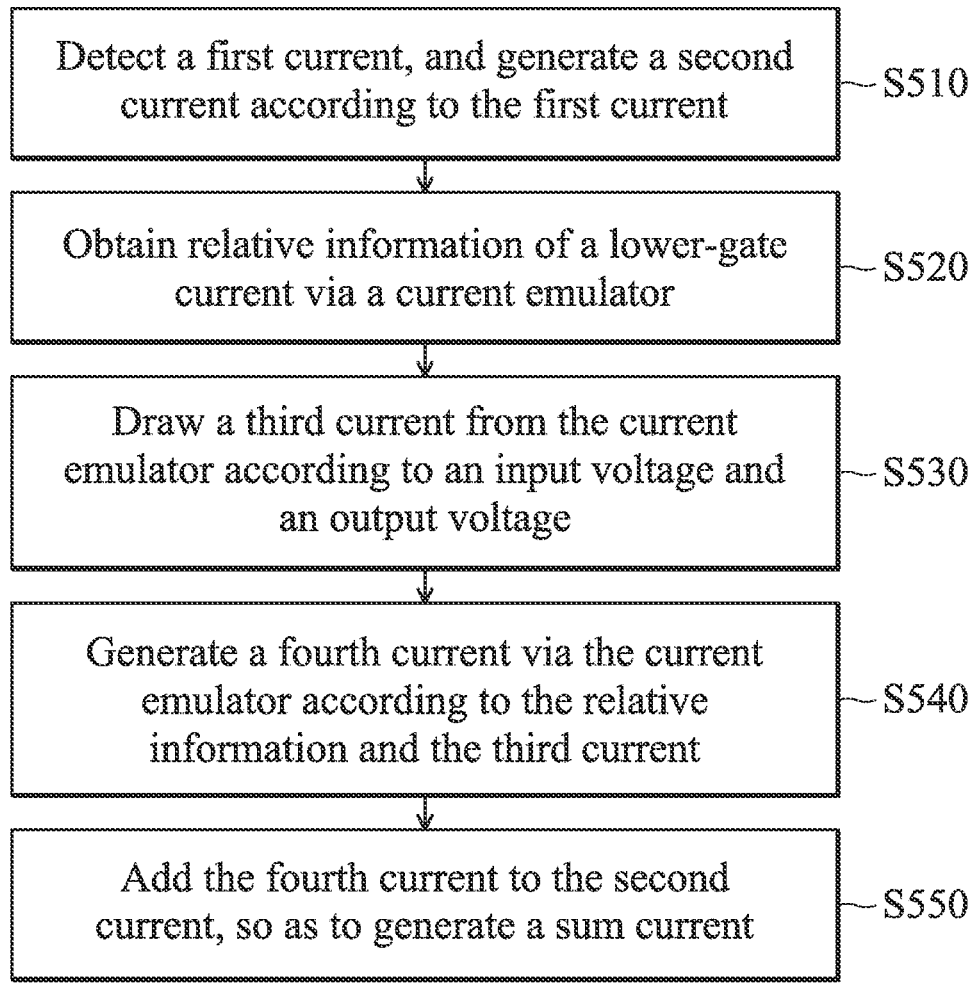
FIG. 5 is a flowchart of a control method for PWM according to an embodiment of the invention.

FIG. 5 is a flowchart of a control method for PWM according to an embodiment of the invention. The aforementioned control method includes the following steps. In the step S510, a first current is detected, and a second current is generated according to the first current. In the step S520, relative information of a lower-gate current is obtained by a current emulator. In the step S530, a third current is drawn from the current emulator according to an input voltage and an output voltage. In the step S540, a fourth current is generated by the current emulator according to the relative information and the third current. In the step S550, the fourth current is added to the second current, so as to generate a sum current. It should be noted that the above steps are not required to be performed in order, and all of the features of the embodiments of FIGS. 1 to 4 may be applied to the control method of FIG. 5.

The invention proposes a novel PWM controller and a control method thereof. In comparison to the conventional design, the invention has at least the advantages of reducing the transient response time, suppressing the output distortion, and enhancing overall linearity, and therefore it is suitable for application in a variety of electronic devices.

Note that the above voltages, currents, resistances, inductances, capacitances and other element parameters are not limitations of the invention. A designer can adjust these parameters according to different requirements. The PWM controller and the control method of the invention are not limited to the configurations of FIGS. 1-5. The invention may merely include any one or more features of any one or more embodiments of FIGS. 1-5. In other words, not all of the features displayed in the figures should be implemented in the PWM controller and the control method of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

The method of the invention, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A PWM (Pulse Width Modulation) controller, comprising:
   a current detector, detecting a first current, and generating a second current according to the first current, wherein the current detector receives an input voltage and outputs an output voltage;
   a current emulator, obtaining relative information of a lower-gate current;
   a voltage-to-current converter, drawing a third current from the current emulator according to the input voltage and the output voltage, wherein the current emulator generates a fourth current according to the relative information of the lower-gate current and the third current; and
   a current adder, adding the fourth current to the second current, so as to generate a sum current.

2. The PWM controller as claimed in claim 1, wherein the second current is substantially proportional to the first current.

3. The PWM controller as claimed in claim 1, wherein the fourth current approaches to the second current.

4. The PWM controller as claimed in claim 1, wherein the current detector comprises:
   a first transistor, wherein the first transistor has a control terminal coupled to a first node, a first terminal coupled to an input node for receiving the input voltage, and a second terminal coupled to a second node;
   an inductor, wherein the inductor has a first terminal coupled to the second node, and a second terminal coupled to an output node for outputting the output voltage;
   a second transistor, wherein the second transistor has a control terminal coupled to the first node, a first terminal coupled to a third node, and a second terminal coupled to the input node; and
   a third transistor, wherein the third transistor has a control terminal coupled to the first node, a first terminal coupled to a fourth node, and a second terminal coupled to the second node;
   wherein the first current flows through the first transistor.

5. The PWM controller as claimed in claim 4, wherein the current detector further comprises:
- a fourth transistor, wherein the fourth transistor has a control terminal coupled to a fifth node, a first terminal coupled to the third node, and a second terminal coupled to the fifth node; and
- a fifth transistor, wherein the fifth transistor has a control terminal coupled to the fifth node, a first terminal coupled to the fourth node, and a second terminal coupled to a sixth node.

6. The PWM controller as claimed in claim 5, wherein the current detector further comprises:
- a sixth transistor, wherein the sixth transistor has a control terminal coupled to a seventh node, a first terminal coupled to the fifth node, and a second terminal coupled to an eighth node; and
- a seventh transistor, wherein the seventh transistor has a control terminal coupled to the seventh node, a first terminal coupled to the sixth node, and a second terminal coupled to a ninth node.

7. The PWM controller as claimed in claim 6, wherein the current detector further comprises:
- an output transistor, wherein the output transistor has a control terminal coupled to the sixth node, a first terminal coupled to the third node, and a second terminal coupled to a first addition node for outputting the second current;
- a first current sink, drawing a first bias current from the eighth node; and
- a second current sink, drawing a second bias current from the ninth node, wherein the second bias current is substantially equal to the first bias current.

8. The PWM controller as claimed in claim 4, wherein each of the first transistor, the second transistor, and the third transistor is an NMOS transistor (N-type Metal Oxide Semiconductor Field Effect Transistor).

9. The PWM controller as claimed in claim 7, wherein each of the fourth transistor, the fifth transistor, the sixth transistor, the seventh transistor, and the output transistor is a PMOS transistor (P-type Metal Oxide Semiconductor Field Effect Transistor).

10. The PWM controller as claimed in claim 1, wherein the current emulator comprises:
- an eighth transistor, wherein the eighth transistor has a control terminal coupled to a tenth node, a first terminal coupled to a ground voltage, and a second terminal coupled to the tenth node for receiving the lower-gate current; and
- a ninth transistor, wherein the ninth transistor has a control terminal coupled to the tenth node, a first terminal coupled to the ground voltage, and a second terminal coupled to an eleventh node.

11. The PWM controller as claimed in claim 10, wherein the current emulator further comprises:
- a tenth transistor, wherein the tenth transistor has a control terminal coupled to the eleventh node, a first terminal coupled to a supply voltage, and a second terminal coupled to the eleventh node;
- a first switch element, wherein the first switch element has a first terminal coupled to the eleventh node, and a second terminal coupled to a twelfth node; and
- a capacitor, wherein the capacitor has a first terminal coupled to the supply voltage, and a second terminal coupled to the twelfth node.

12. The PWM controller as claimed in claim 11, wherein the current emulator further comprises:
- an eleventh transistor, wherein the eleventh transistor has a control terminal coupled to the twelfth node, a first terminal coupled to the supply voltage, and a second terminal coupled to a second addition node for outputting the fourth current; and
- a second switch element, wherein the second switch element has a first terminal coupled to the twelfth node, and a second terminal coupled to a thirteenth node.

13. The PWM controller as claimed in claim 10, wherein each of the eighth transistor and the ninth transistor is an NMOS transistor.

14. The PWM controller as claimed in claim 12, wherein each of the tenth transistor and the eleventh transistor is a PMOS transistor.

15. The PWM controller as claimed in claim 12, wherein the first switch element is selectively closed or opened according to a first control voltage, and the second switch element is selectively closed or opened according to a second control voltage.

16. The PWM controller as claimed in claim 15, wherein the first control voltage and the second control voltage substantially have complementary logic levels.

17. The PWM controller as claimed in claim 12, wherein the voltage-to-current converter comprises:
- a first resistor, wherein the first resistor has a first terminal for receiving the input voltage, and a second terminal coupled to a fourteenth node; and
- a second resistor, wherein the second resistor has a first terminal coupled to the fourteenth node, and a second terminal coupled to the ground voltage.

18. The PWM controller as claimed in claim 17, wherein the voltage-to-current converter further comprises:
- a third resistor, wherein the third resistor has a first terminal for receiving the output voltage, and a second terminal coupled to a fifteenth node; and
- a fourth resistor, wherein the fourth resistor has a first terminal coupled to the fifteenth node, and a second terminal coupled to the ground voltage.

19. The PWM controller as claimed in claim 18, wherein the voltage-to-current converter further comprises:
- a comparison circuit, wherein the comparison circuit has a positive input terminal coupled to the fourteenth node, a negative input terminal coupled to the fifteenth node, and an output terminal for outputting a third control voltage; and
- a dependent current sink, drawing the third current from the thirteenth node according to the third control voltage, wherein the third current is substantially proportional to a voltage difference between the input voltage and the output voltage.

20. A control method for PWM, comprising the steps of:
- detecting a first current, and generating a second current according to the first current;
- obtaining relative information of a lower-gate current via a current emulator;
- drawing a third current from the current emulator according to an input voltage and an output voltage;
- generating a fourth current via the current emulator according to the relative information of the lower-gate current and the third current; and
- adding the fourth current to the second current, so as to generate a sum current.

* * * * *